(12) United States Patent
Liu et al.

(10) Patent No.: US 6,377,448 B1
(45) Date of Patent: Apr. 23, 2002

(54) DEVICE HOUSING WITH A GROUNDING CLIP

(75) Inventors: Alvin Liu, Pa-Li; Yu-Tai Liu, Hsin-Chuang, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/436,090

(22) Filed: Nov. 8, 1999

(51) Int. Cl.[7] .............................. G06F 1/16; H05K 7/14
(52) U.S. Cl. ....................... 361/685; 361/686; 361/728; 361/752; 361/753; 361/799
(58) Field of Search ................. 361/685, 686, 361/682–684, 725, 727, 728–731, 736, 741, 752, 753, 796, 799; 174/35 R, 138 G

(56) References Cited

U.S. PATENT DOCUMENTS

| | | | |
|---|---|---|---|
| 5,490,043 A | * 2/1996 | Tan et al. ................... | 361/818 |
| 5,588,728 A | * 12/1996 | Eldridge et al. ........ | 312/332.1 |
| 5,588,850 A | * 12/1996 | Pan et al. .................. | 439/92 |
| 5,668,696 A | * 9/1997 | Schmitt ..................... | 361/685 |
| RE35,915 E | * 10/1998 | Hastings et al. ............ | 439/377 |
| 5,921,644 A | * 7/1999 | Brunel et al. ............ | 312/223.2 |
| 5,969,901 A | * 10/1999 | Eckberg et al. .......... | 360/97.01 |
| 6,102,499 A | * 8/2000 | Chen et al. .............. | 312/223.2 |

FOREIGN PATENT DOCUMENTS

| | | | | |
|---|---|---|---|---|
| GB | 2320619 A | * | 6/1998 | ............ H05K/1/02 |
| JP | 8-235336 A | * | 9/1996 | .......... G06K/19/77 |

* cited by examiner

*Primary Examiner*—Leo P. Picard
*Assistant Examiner*—Anatoly Vortman
(74) *Attorney, Agent, or Firm*—Wei Te Chung

(57) ABSTRACT

A device housing adapted to receive a data storage device therein includes a base and a pair of grounding clips attached to the base. The base includes a pair of side walls each defining a pair of gaps. Each grounding clip forms a pair of fixing portions for engaging with the gaps of the base. A contact finger extends from each fixing portion for contacting the data storage device to form a grounding path from the data storage device internal to the housing to an outside of the side walls.

10 Claims, 6 Drawing Sheets

DEVICE HOUSING WITH A GROUNDING CLIP

BACKGROUND OF THE INVENTION

1. Field of the Invention

The present invention relates to a device housing for receiving a data storage drive therein, and particularly to a device housing having a grounding clip which is capable of grounding the drive.

2. The Related Art

A device housing is generally used to receive a data storage drive such as a floppy disk drive (FDD), a hard disk drive (HDD) or a compact disc-read only memory (CD-ROM) drive for insertion into a device bay of a computer and electrical connection with the computer. The device housing is made of a plastic material so that electrostatic charges produced by the data storage device easily accumulate on the device housing. Thus, the device housing may produce electrostatic discharge which can reduce the stability of the computer system or even damage electronic components of the computer.

To counter this problem, a conventional device housing is grounded through the shielding of a connector attached thereon, which electrically connects to the shielding of a complementary connector inside the computer. However, because the device housing is insulated, the connector shielding on the device housing just grounds a part of the device housing. Furthermore, when the connector on the device housing is disconnected from the complementary connector, the device housing is not grounded and thus readily produces electrostatic discharge. Thus, a more effective means for grounding the device housing is desired.

Additionally, the means is required to be simple to facilitate assembly.

SUMMARY OF THE INVENTION

Accordingly, an object of the present invention is to provide a device housing with a grounding clip facilitating grounding a device received therein.

Another object of the present invention is to provide a grounding clip for a device housing having a simplified assembly.

To fulfil the above mentioned objects, a device housing in accordance with the present invention is adapted to receive a data storage device therein. The device housing comprises a base and a grounding clip attached to the base. The base comprises a pair of side walls and at least one side wall defines a pair of gaps. The grounding clip forms a pair of fixing portions for engaging with the gaps of the base. A contact finger extends from each fixing portion for contacting the data storage device to form a grounding path from the data storage device internal to the housing to an outside of the side wall.

Other objects and advantages of the present invention will be understood from the following description of a preferred embodiment thereof with reference to the accompanying drawings, wherein:

DETAILED DESCRIPTION OF THE PREFERRED EMBODIMENT

Figure 1:
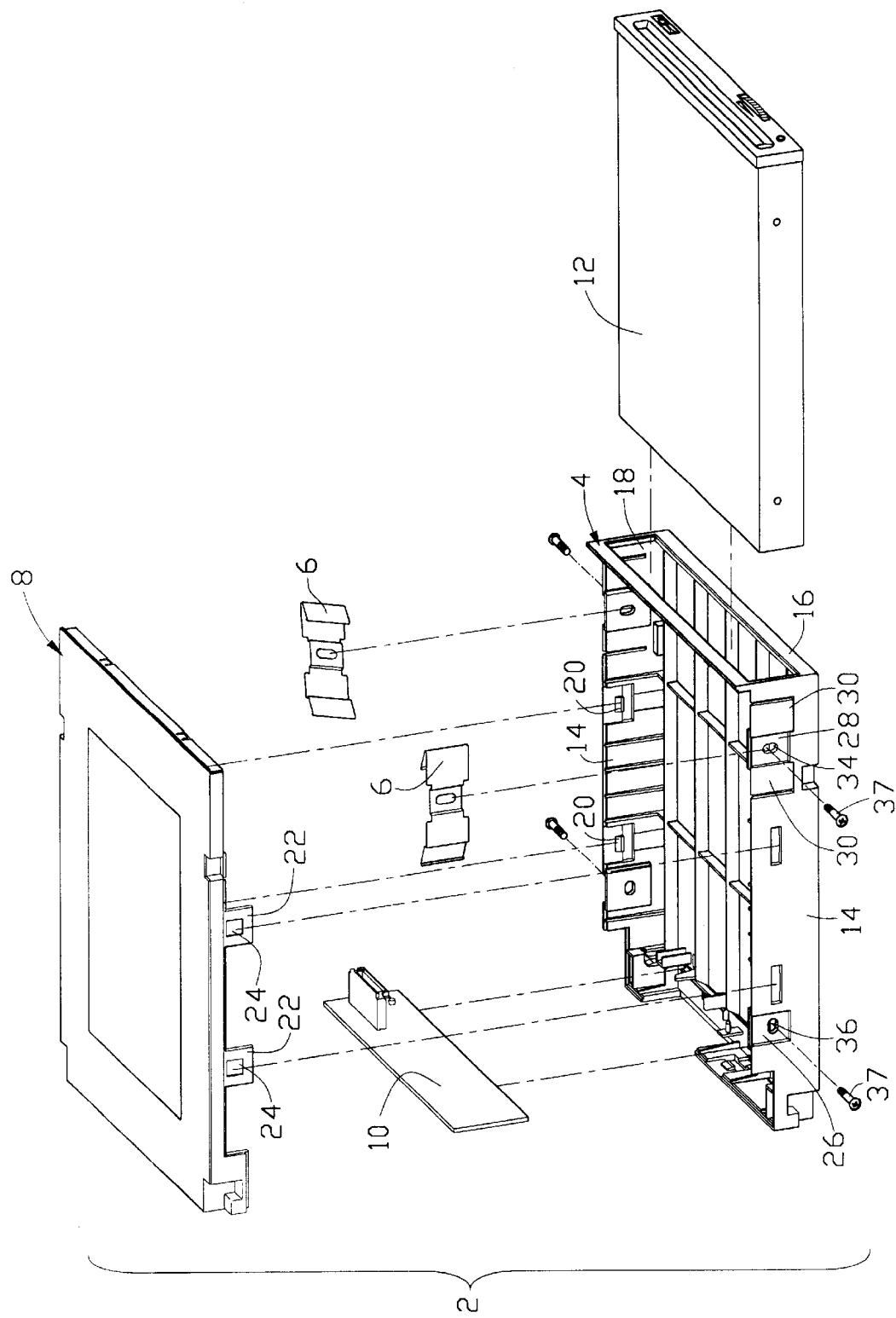
FIG. 1 is an exploded view of a device housing in accordance with the present invention and a CD-ROM drive to be received therein.
Figure 2:
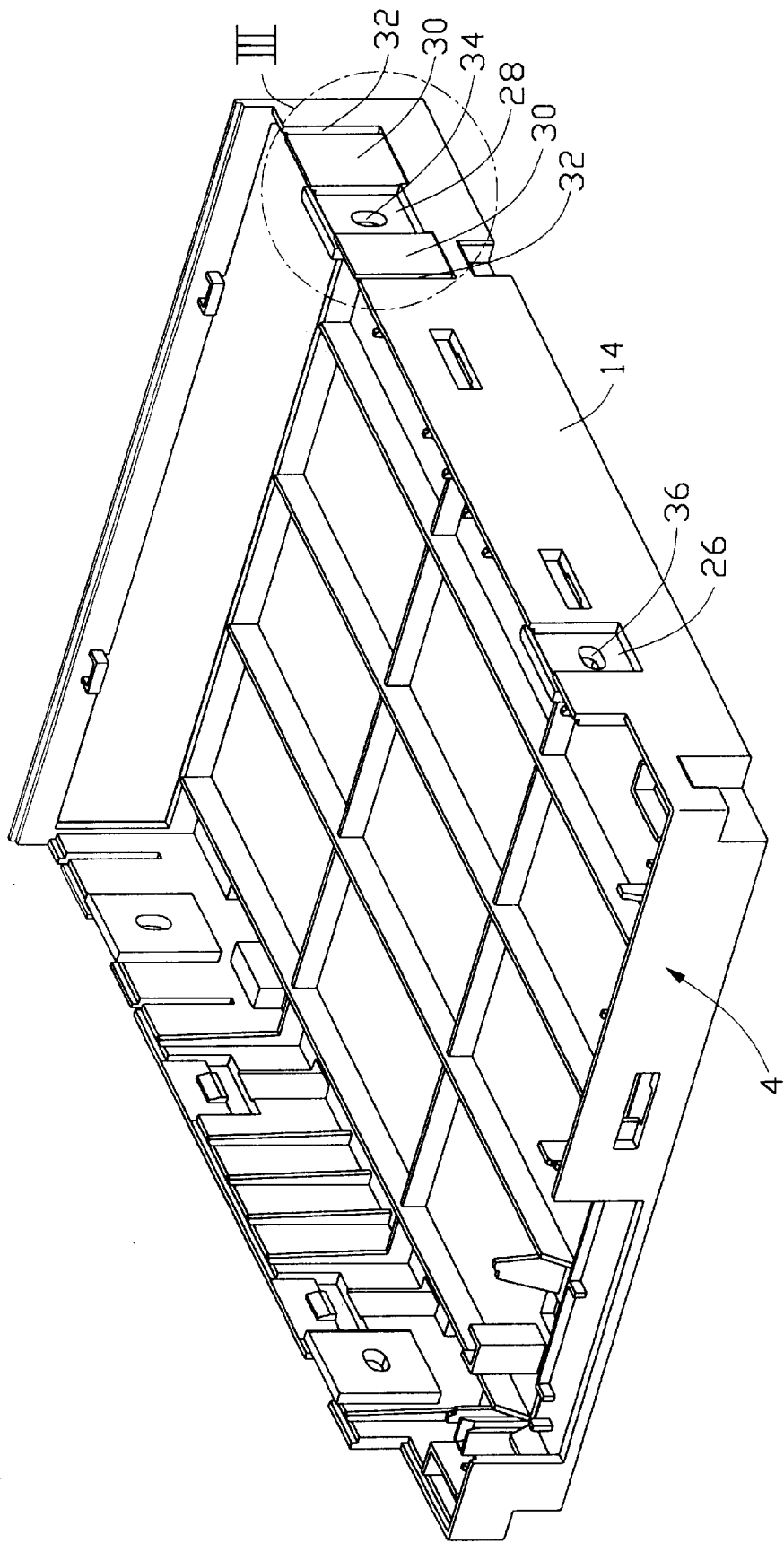
FIG. 2 is a perspective view of a base in accordance with the present invention.
Figure 3:
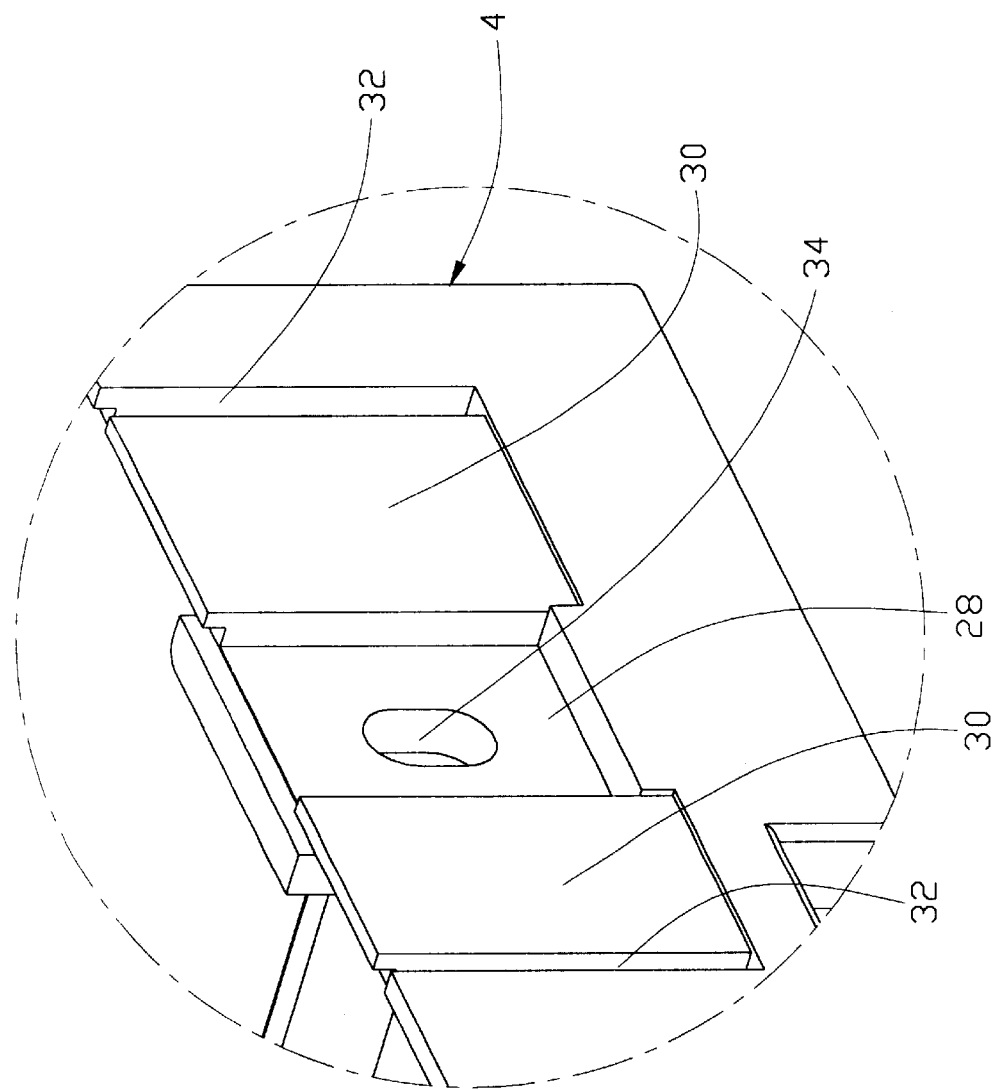
FIG. 3 is an enlarged view of an encircled portion III of FIG. 2.
Figure 4:
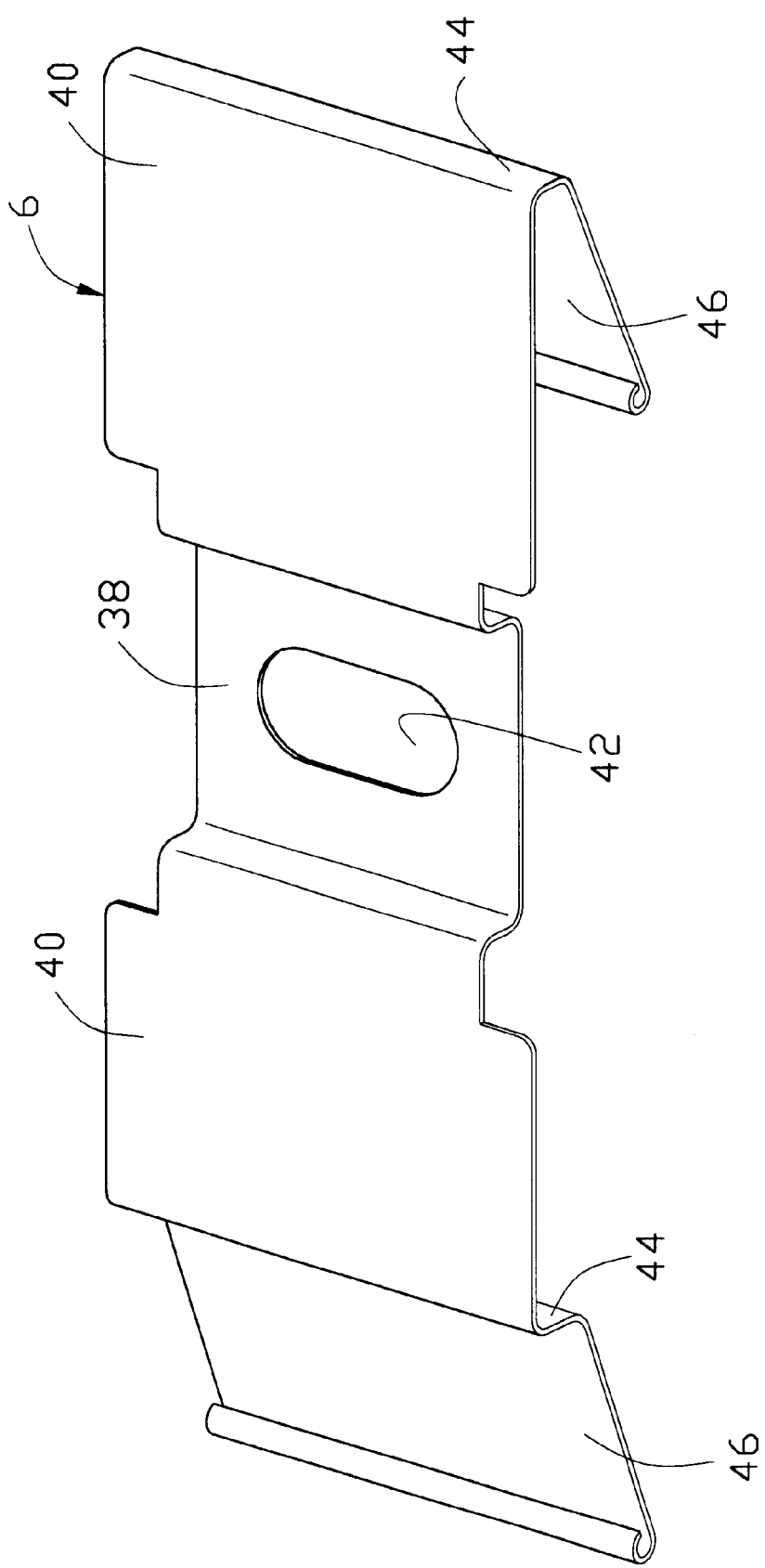
FIG. 4 is a perspective view of a grounding clip in accordance with the present invention.

Referring to FIGS. 1–4, a device housing 2 in accordance with the present invention includes a base 4, a pair of grounding clips 6 attached to the base 4, a cover 8 covered the base 4 and a connector assembly 10 secured between the base 4 and the cover 8. A data storage device such as a CD-ROM drive 12 in this embodiment can be received between the base 4 and the cover 8 and electrically connect to the connector assembly 10. The base 4 includes a pair of side walls 14 and a front wall 16 connected between the side walls 14. The front wall 16 defines an opening 18 for providing access to the CD-ROM drive 12. Each side wall 14 forms a pair of protrusions 20 at an inner surface thereof. A pair of tabs 22 extends from each of opposite side edges of the cover 8. Each tab 22 defines an aperture 24 for engagingly receiving the protrusion 20 of the base 4.

Each side wall 14 defines a first recessed wall 26 and a second recessed wall 28 toward the inner surface thereof., A pair of stepped walls 30 is formed at each side of each second recessed wall 28. A gap 32 is defined between each stepped wall 30 and the side wall 14. Each second recessed wall 28 defines a vertical long hole 34 and each first recessed wall 26 defines a horizontal long hole 36 both for extension of a bolt 37.

The grounding clip 6 includes a body 38 and a pair of wings 40 extending from opposite edges of the body 38. The body 38 is slightly U-shaped for abutting against the second recessed wall 28 of the base 4. A vertical slot 42 is defined in the body 38 corresponding to the vertical hole 34 of the base 4. The wings 40 abut against the stepped walls 30 of the base 4 to contact another component (not shown) outside the device housing 2 for forming an external grounding path. A fixing portion 44 extends from a distal end of each wing 40 for engaging with the gaps 32 of the base 4. A pair of contact fingers 46 respectively extends from the fixing portions 44 in the same direction for contacting the CD-ROM drive 12 to form an internal grounding path from an inside of the device housing 2 to the wings 40. Thus, the grounding clip 6 can implement the grounding of the CD-ROM drive 12.

Figure 5:
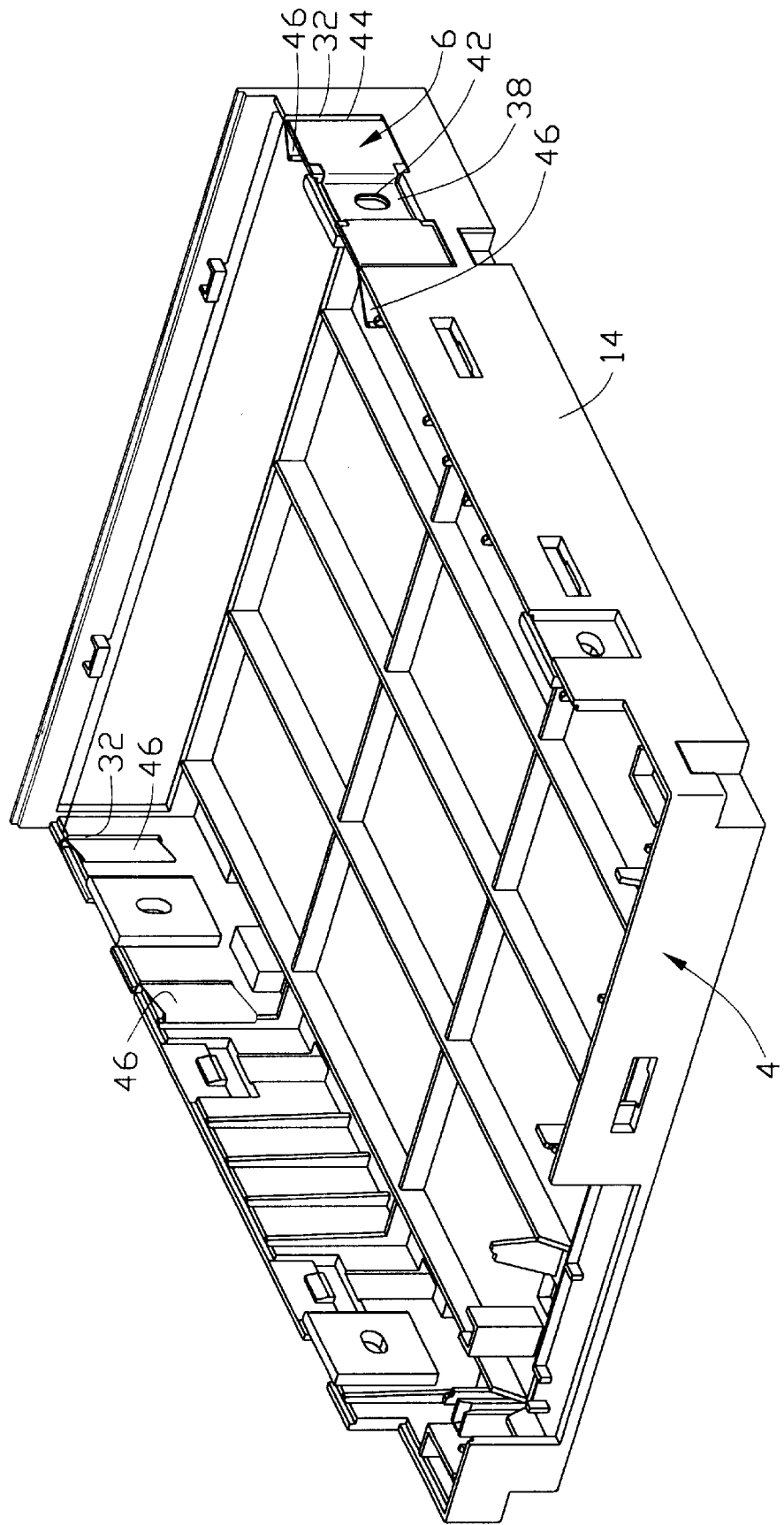
FIG. 5 is a perspective view of a base in accordance with the present invention showing a pair of grounding clips assembled to the base.
Figure 6:
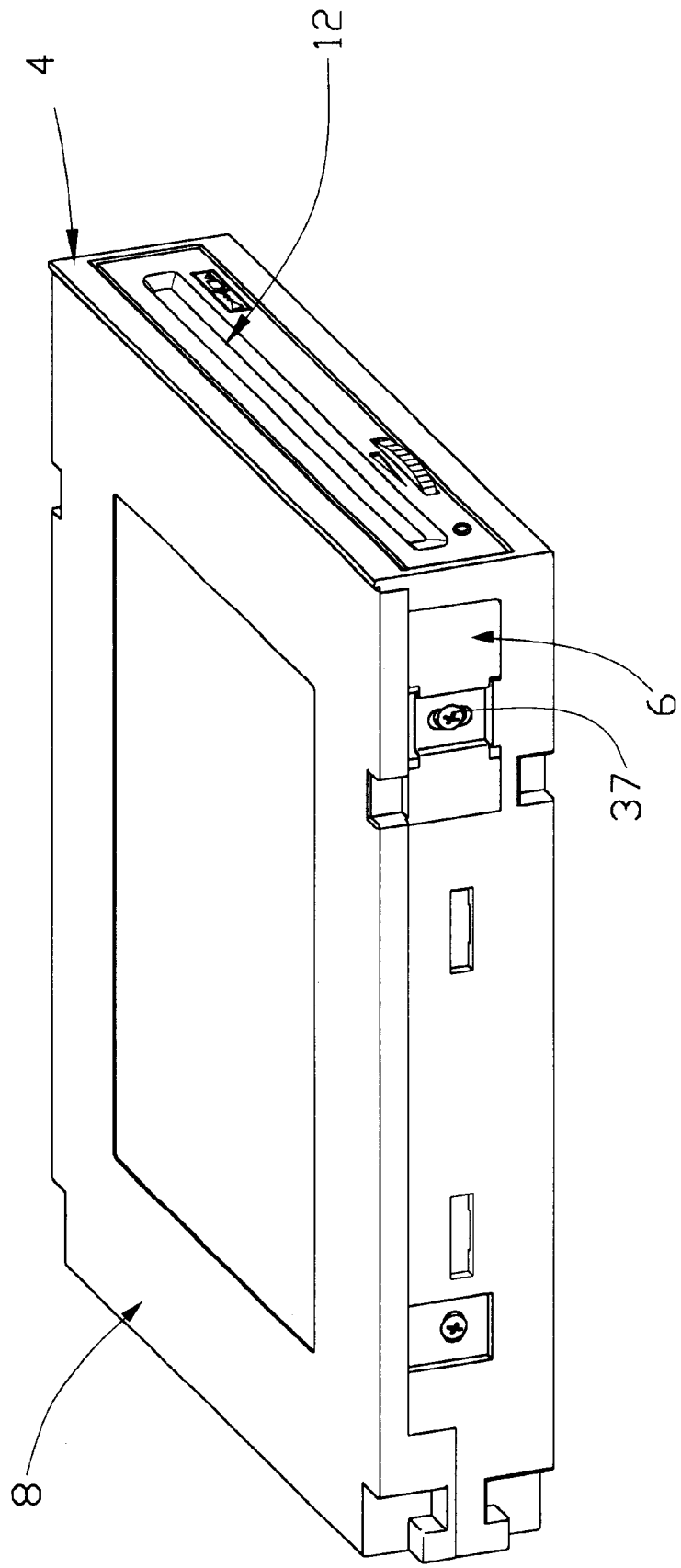
FIG. 6 is an assembled view of FIG. 1.

Referring to FIGS. 1 and 4–6, in assembly, the grounding clips 6 are attached to the base 4, the cover 8 engagingly attached to the base 4, and the connector assembly 10 secured between the cover 8 and the base 4. The CD-ROM drive 12 extends through the opening 18 of the base 4 to electrically connect to the connector assembly 10 while also contacting the grounding clips 6. Two pairs of bolts 37 respectively extend through the vertical slots 42 of the grounding clips 6 and the vertical holes 34 of the base 4 and through the horizontal holes 36 of the base 4 and then threadedly engage with the CD-ROM drive 12 thereby securely fixing the CD-ROM drive 12 to the device housing 2.

The body 38 of the grounding clip 6 abuts against the second recessed wall 28 of the base 4 with the vertical slot 42 thereof aligning with the vertical hole 34 of the second recessed wall 28. The pair of wings 40 abuts against the pair of stepped walls 30 for contacting an external component thereby forming an external grounding path. The fixing portions 44 are engagingly received in the gaps 32 of the base 4 for fixing the grounding clips 6 to the base 4. The contact fingers 46 project from the inner surfaces of the side walls 14 for resiliently contacting the CD-ROM drive 12 to form an internal grounding path. Thus, the device housing 2 can reliably and conveniently ground the CD-ROM drive 12 thereby preventing electrostatic discharge. Furthermore, the grounding clips 6 are easily assembled in the base 4.

It will be understood that the present invention may be embodied in other forms without departing from the spirit thereof. The present example and embodiment, therefore, is to be considered in all respects as illustrative and not restrictive, and the invention is not to be limited to the details given herein.

What is claimed is:

1. A device housing adapted to receive a data storage device therein, comprising:
   a base comprising a pair of side walls, at least one side wall defining a pair of gaps and forming a recessed wall toward an inner surface thereof, the recessed wall defining a hole; and
   a grounding clip attached to the base, the grounding clip forming a body to abut against the recessed wall, and a pair of fixing portions for engaging with the gaps of the base, the body of the grounding clip defining a slot for aligning with the hole of the recessed wall, a contact finger extending from each fixing portion for contacting the data storage device to form an internal electrostatic grounding path.

2. The device housing as described in claim 1, wherein the side wall of the base forms a stepped wall toward an inner surface thereof, and wherein each gap is defined between the side wall and the stepped wall.

3. The device housing as described in claim 2, wherein the grounding clip forms a wing to abut against the stepped wall for forming an external grounding path, and wherein the fixing portion extends from an edge of the wing.

4. A grounding clip for a device housing adapted to receive a data storage device therein, comprising:
   a body adapting for abutting against the device housing;
   at least one wing extending from the body to form an external grounding path, the wing being parallel to the body and stepped from the body;
   at least one fixing portion extending from the wing adapted for engaging with the device housing; and
   at least one contact finger extending from the fixing portion to form a grounding path from the device internal to the device housing to the at least one wing to form an internal grounding path.

5. The grounding clip for a device housing as claimed in claim 4, wherein the grounding clip comprises a pair of wings.

6. The grounding clip for a device housing as described in claim 4, wherein the grounding clip comprises a pair of fixing portions.

7. The grounding clip for a device housing as described in claim 4, wherein the grounding clip comprises a pair of contact fingers.

8. A data storage device assembly comprising:
   a device housing comprising a pair of side walls with screw holes therein;
   a data storage device with holes therein in alignment with the screw holes, respectively;
   a plurality of grounding clips each including a body with a slot therein in alignment with the corresponding hole; and
   a bolt extending through the corresponding slot, screw hole and hole to fasten the grounding clip, the housing and the data storage device together; wherein
   said grounding clip defines a wing extending outside the housing and a contact finger extending inside the housing and contacting the inner data storage device.

9. The assembly as described in claim 8, wherein said grounding clip including a pair of wings by two sides of the body, and a pair of contacting fingers extending respectively from the pair of wings, and said pair of wings are coplanar with each other while said pair of contacting fingers are parallel to each other.

10. A device housing adapted to receive a data storage device therein, comprising:
    a base comprising a pair of side walls, at least one side wall defining a pair of gaps and forming a stepped wall toward an inner surface of the at least one side wall, each gap being defined between the side wall and the stepped wall; and
    a grounding clip attached to the base and forming a pair of fixing portions for engaging with the gaps of the base, a contact finger extending from each fixing portion for contacting the data storage device to form an internal electrostatic grounding path;
    wherein the grounding clip forms a wing to abut against the stepped wall for forming an external grounding path, and wherein the fixing portion extends from an edge of the wing.

* * * * *